United States Patent [19]

Young

[11] Patent Number: 4,755,147
[45] Date of Patent: Jul. 5, 1988

[54] FLEX HEAD CONNECTOR WITH GROUND PLANE

[75] Inventor: Steven J. Young, Minneapolis, Minn.

[73] Assignee: Control Data Corporation, Minneapolis, Minn.

[21] Appl. No.: 865,491

[22] Filed: May 20, 1986

[51] Int. Cl.⁴ .......................... H01R 9/07; H05K 1/11
[52] U.S. Cl. ...................................... 439/77; 361/398; 439/92; 439/497
[58] Field of Search .......... 339/176 MF, 17 M, 14 R, 339/143 R; 439/77, 92, 108, 493, 497; 361/398, 408

[56] References Cited

U.S. PATENT DOCUMENTS

| | | | |
|---|---|---|---|
| 3,401,369 | 9/1968 | Palmateer et al. | 339/143 R X |
| 3,643,201 | 2/1972 | Harwood | 339/14 R X |
| 3,923,364 | 12/1975 | Shapiro et al. | 439/497 |
| 4,587,596 | 5/1986 | Bunnell | 339/17 M |
| 4,709,300 | 11/1987 | Landis | 361/398 |
| 4,714,435 | 12/1987 | Stipanuk et al. | 439/497 X |

FOREIGN PATENT DOCUMENTS 7713909 6/1978 Netherlands .................. 361/408

Primary Examiner—Z. R. Bilinsky
Attorney, Agent, or Firm—Joseph A. Genovese; Edward P. Heller

[57] ABSTRACT

A flexible head connector with a ground plane for connecting a daughter board to a mother board.

8 Claims, 2 Drawing Sheets

FLEX HEAD CONNECTOR WITH GROUND PLANE

This Government has rights in this invention pursuant to Contract No. N00019-84-C-0098 issued by the Department of Defense.

BACKGROUND OF THE INVENTION

1. Field of the Invention

The invention relates to the field of connectors and more particularly to connectors between mother and daughter boards.

2. Brief Description of the Prior Art

Ground planes have been included in flexible printed circuits heretofore: those having one plane being known as microstrip flexible printed circuits, and those having two planes sandwiching the logic traces being known as stripline flexible printed circuits. Typically, the ground plane connections to other circuits or boards include through-hole type connections. This avoids the lead alignment problem discussed below.

While ground planes have been included in connectors between mother and daughter boards, see, e.g., Franck U.S. Pat. No. 3,582,865 and ground plane 39 at FIG. 4, prior flex circuit connectors between mother and daughter boards which include MIL-C-28754 Type III head connectors have not included ground planes. In FIG. 1, the head 10 is the prior art mil-spec head, and a prior flex connector looked like the flex connector 20 of the preferred embodiment without the ground plane. The flex connector of the prior art includes holes in a base portion which mate with pins 14 inside bushings 12 on the head 10. After mating, the pins are soldered. The flex connector of the prior art is also soldered to the printed circuit daughter board 40 via leads 30 which are soldered to pads, not shown, mounted on the printed circuit board 40, after which lead support 54 is cut off.

Applicant believes one reason ground planes have not heretofore been included in flex circuit connectors is that the ground plane stiffens the flex connector, which may lead to increased stress-related lead fractures under the vibrations of military conditions.

A problem faced by those who wish to include a ground plane in flex circuit connectors is the difficulty in aligning the leads from the logic traces and ground plane, separated as they must be by an intervening insulating layer. FIG. 2 shows the separation of the ground plane 60 from logic traces 70 by an insulating layer 80. FIG. 3 shows a plan view of the logic traces 70 and the leads 72 connected thereto. Interspersed among the logic trace leads are ground leads 74. In the illustrated example, ground leads coming from the reverse side of the insulating layer 80 are slightly offset from the leads of the logic traces.

Despite these difficulties, ground planes in flex circuit connectors are increasingly required because the speed of operations of the circuits are increasing, leading to circuit impedance mismatches between mother and daughter boards and further causing localized ground potential shift due to the switching of numerous circuits at one time. Impedance mismatches and ground potential shifts may cause marginal signals to be misinterpreted.

SUMMARY OF THE INVENTION

The invention comprises the inclusion of a ground plane in a flex circuit connector. A bending radius restriction reduces stress on the connector. A preferred head connector hole assignment pattern for connections to the head pins assures that logic circuit connection holes are adjacent to at least one ground or power pin. This extends the effect of the ground plane through the head connector to the mother board.

DETAILED DESCRIPTION OF THE PREFERRED EMBODIMENT

Figure 1:
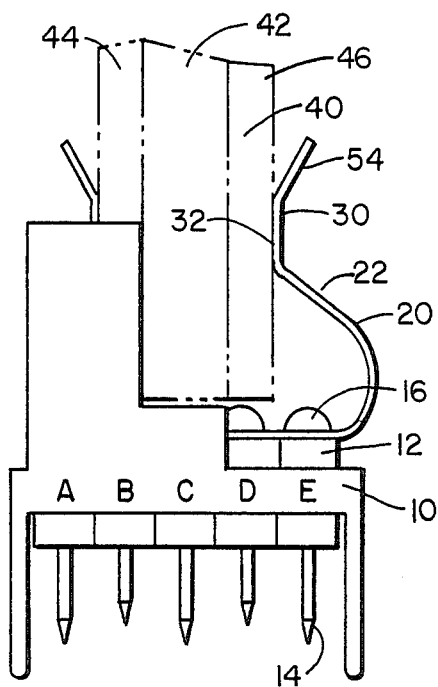
FIG. 1 is an end plan view of a flex circuit connector according to the present invention mounted on a head connector and, in phantom line, a daughter board.

FIG. 1 shows the flex circuit connector 20 of the preferred embodiment mounted on the head connector 10 of the prior art by means of pins 14 inside bushings 12 which connect through holes, discussed below, in the flex connector 20 and soldered at solder joints 16. The head connector 10 may be plugged into a mother board (not shown) via pins 14. There are five such pins shown in the drawing, and they are labeled A, B, C, D, and E. The same five pins 14 inside bushings 12 connect through holes in the flex circuit horizontally across the bottom of the flex connector in the drawing. The five flex connector holes, as further described below, comprise one column of holes. The flex connector 20 has a plurality of such columns, which together form a matrix of holes having rows and columns. The matrix is discussed in detail below.

The flex circuit connector 20 is bent at opposite sides thereof, upwardly and inwardly, toward the daughter board 40 (shown in phantom line). A portion 22 of the upwardly extending sides of the flex circuit connector 20 are insulated. Extending from the insulated portion 22 are leads 30, which are bent to a vertical orientation and soldered to the daughter board at a point 32, which typically comprises solder pad on the daughter board. The preferred daughter board is shown as having a heat sink 42 in the center and two lateral circuit boards 44 and 46, to which the opposite sides of the flex circuit connector 20 are soldered attached.

Figure 2:
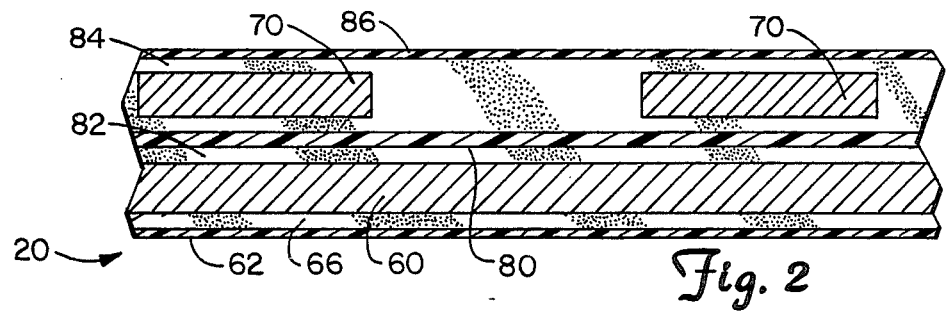
FIG. 2 is a cross-sectional view of the flex circuit connector taken along 22 of FIG. 5.

FIG. 2 shows a cross section of the flex circuit connector 20 at an insulated portion thereof. As can be seen from the figure, the flex circuit connector comprises layers of insulation, adhesive and conductor from bottom to top as follows: an outer layer of insulation 62 is adhesively attached via adhesive layer 66 to a beryllium copper alloy ground plane 60, which is, in turn, adhesively attached by adhesive 82 to an inner insulation layer 80, which is, in turn, adhesively attached to logic circuit traces 70 by adhesive 84, which also attaches to a top outer layer of insulation 86. In the preferred embodiment, the layers of insulation are composed of polyimide. The traces are the same alloy of beryllium copper and the adhesive is preferably Pyralux w/a from DuPont. The laminate structure may be formed by conventional polyimide temperature and pressure curing techniques with the addition of an alignment step to align the leads of the traces and ground plane, discussed in more detail below.

In the preferred embodiment the outer layers of insulation are 0.0005 inches thick, while the inner polyimide layer is 0.0010 inches thick. The adhesive layers surrounding the ground plane 60 are preferably 0.0015 inches thick, while the adhesive layer surrounding the logic traces 70 is preferably 0.0030+0.0020/−0.0010 inches thick. Thus the whole laminate structure is preferably 0.0150 inches thick.

Figure 3:
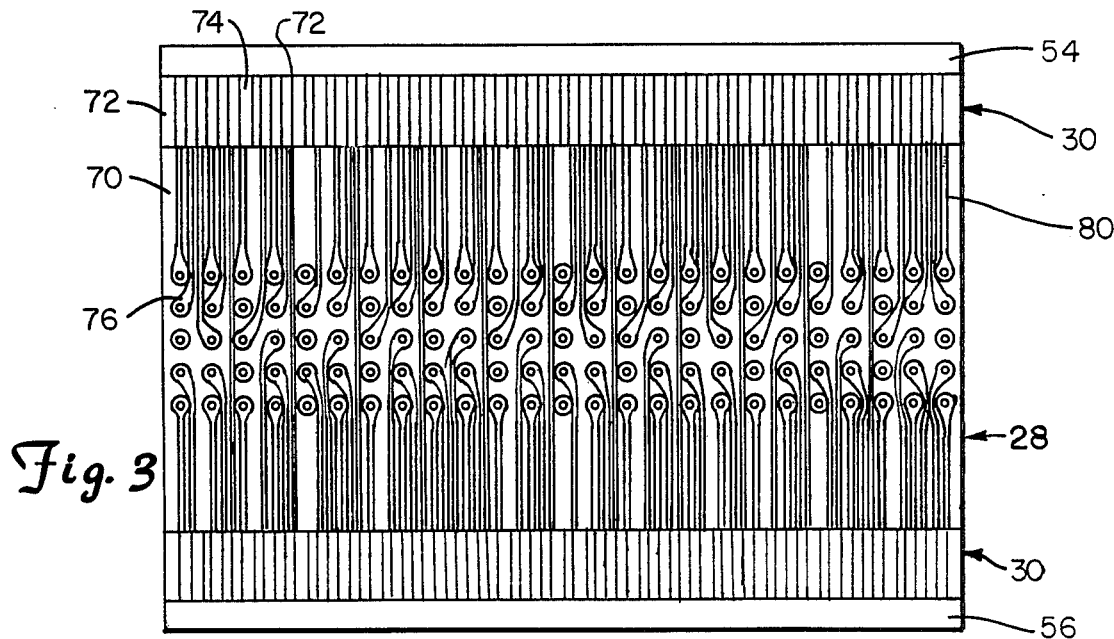
FIG. 3 is a plan view of the logic trace side of the flex circuit connector with the outer insulating layers removed.

FIG. 3 shows a plan view of the logic trace side of the flex circuit connector 20 prior to bending the connector into the preferred shape shown in FIG. 1. As can be seen from the drawing, the logic traces extend from a central region which comprises rows and columns of holes to an outer edge portion of inner insulation layer 80 where they connect to leads 30, which in turn connect to lead supports 54 and 56. The lead supports are trimmed from the leads 30 after the leads 30 have been soldered to the daughter board 40.

As can be seen from the drawing, not all the holes in the central portion of the flex circuit connector have logic traces connected thereto. These holes are reserved for connection to the ground plane mounted on the other side of the inner insulation layer 80. The larger gaps between logic traces extending to the edge of the inner insulation layer 80 and from which leads 74 extend are the location of the leads connected to the ground plane which are better shown in FIG. 4. Without care during assembly, some misalignment between the ground plane leads 74 and the logic trace leads 72 may occur. This misalignment is not acceptable in a commercial embodiment of the present invention. In a commercial embodiment of the present invention, all the leads 74 and 72 must be substantially evenly spaced for attachment to the pads on the daughter board.

Alignment of the leads is preferably accomplished during laminate assembly by including locating holes in outer insulation layers 62 and 86 extensions which are later trimmed. Pins inserted in these holes and as well as pins in the through-holes of the logic traces and ground planes allow alignment of the outer insulation layers and the logic traces or ground plane adhesively attached thereto to be aligned by pins as the two sublaminate structures are adhesively attached to the inner insulation layer 80.

Figure 4:
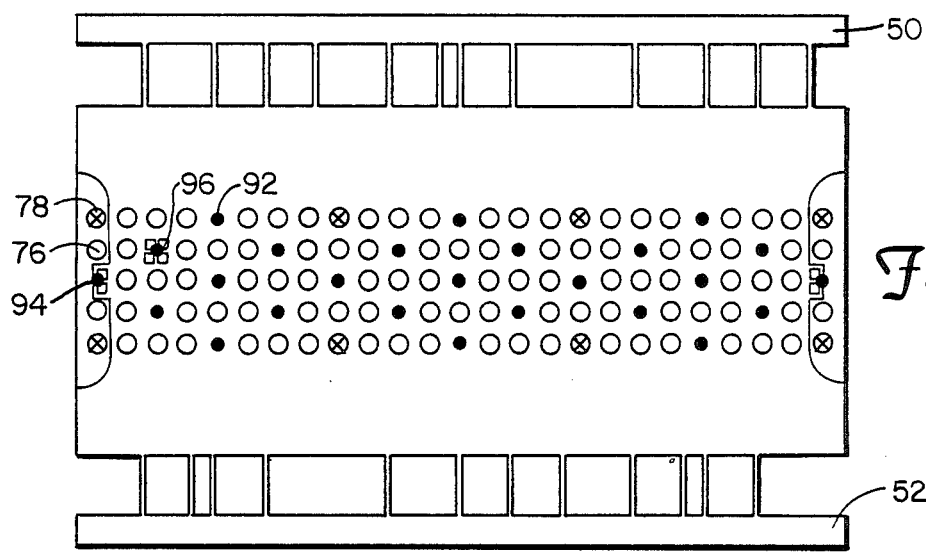
FIG. 4 is a plan view of the ground plane, including lead supports prior to bending.

FIG. 4 is a plan view of the ground plane of the preferred embodiment including leads 74 extending to lead supports 50 and 52. These leads supports align with the lead supports 54 and 56 of the logic traces. The leads are later coated with solder so they may be later soldered to the pads on the daughterboard. The solder process causes the aligned lead supports to stick together; thus in figures showing the combined structure, we refer to lead supports 54 and 56.

Located in the central portion of the ground plane 60, is a 5x25 matrix of holes 90. The holes are comprised of logic trace holes 76, some of which are designated as power circuit connections 78 (these are marked by the X's) and a series of ground plane hole 92. The ground plane is actually connected to each hole via strut and hub extensions 94 and 96. A first form of strut and hub extension 94 occurs in hole three at the left and right edges of the ground plane shown in the figure, while the second form of the strut and hub extension 96, shown in FIG. 4a, comprise the balance of the ground plane holes 92.

Figure 4A:
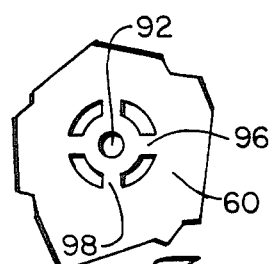
FIG. 4a is a detail of the strut and hub of a ground plane hole.

FIG. 4A shows a detail of a ground hole 92 and shows struts 96 extending from the ground plane 60 to an inner hub 98 surrounding the hole 92. This structure increases the solderability of a pin to the hole by reducing the thermal path to the highly heat-conductive ground plane 60.

As can be seen from the figure, the arrangement of ground plane holes to circuit trace holes and power circuit holes is not arbitrary but specifically chosen such that a logic trace hole is adjacent in either a column direction or a row direction to either a ground plane hole or a power circuit hole. This arrangement extends the electrical function of the ground plane through the pins of the head connector to a certain degree and helps reduce both impedance mismatching between daughter board and mother board circuits and also helps in reducing localized ground potential shift experienced when large numbers of circuits switch simultaneously by reducing inductance between the ground plane surface and the ground of the mother board.

In the preferred embodiment, the power circuit holes are arranged in the first and fifth rows of the hole matrix 90 in column number 1, 9, 17 and 25. The ground plane holes are located in the third row of the first column, in rows 2 and 4 of the third column, rows 1, 3 and 5 of the fifth column, rows 2 and 4 of the seventh column, and row 3 of the ninth column. This pattern, 1-2-3-2-1-2-3-2-1, repeats to the 25th column, skipping every even numbered column.

Figure 5:
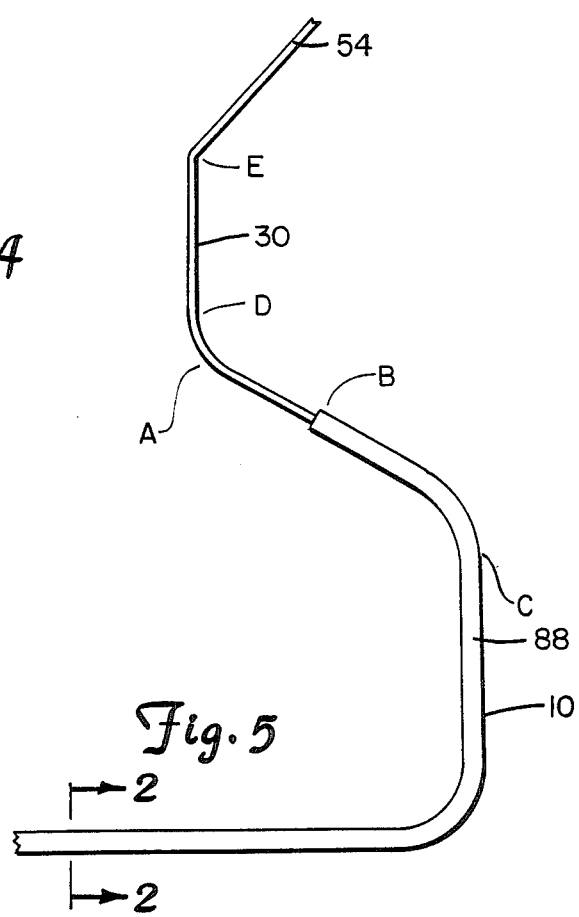
FIG. 5 shows an end plan view of the flex circuit connector and the bending structure therefor.

FIG. 5 shows the preferred bending structure of the preferred embodiment. The horizontally planar base portion is the portion in which the hole matrix 90 is located and is adapted for connection to the pins 14 inside bushings 12 of the head connector 10. On opposite sides of planar portion 100 the flex circuit connector 10 is bent upwards to form vertically oriented portions, the outside radius of the bend being chosen such that the ratio of the arc to the radius is less than and equal to 0.069/0.050 or 1.38 pi radians. In the preferred embodiment, the minimum radius is 0.050 inches. Thereafter, at a point C, which is at a predetermined distance up the vertically extending sides the insulated portion of the flex connector 10 is bent inwardly with a curve having a minimum radius such that the ratio of arc to radius is less than and equal to 0.071/0.074 or 0.96 pi radians. In the preferred embodiment, the minimum radius is 0.074 inches.

The point of these two bends is to allow the flex connector to occupy a minimum of lateral space while also preventing bending at the point where the insulation ends and the leads 30 begins.

At the point where leads 30, comprised of logic trace leads 72 and ground plane leads 74, extend from the insulation, denoted as B, the leads 30 are bent together in a smooth transition between point B and a point A.

From point A to a point D, the leads, now aligned, are bent in an outward direction until they are vertically aligned. The minimum radius of bend between these points is determined by the formula arc divided by radius is greater than and equal to 0.049/0.049 or 1.0 pi radians. In the preferred embodiment, the minimum radius is 0.052+/−0.007 inches. The vertically extending portion from D to a point E are the areas of the leads which may be soldered to the pads of a daughter board 40 shown in FIG. 1.

After soldering of the leads to the daughter board, the remaining portions of the leads comprise lead supports 50, 52, 54 and 56 are bent away from the daughter board at an angle 45 degrees and are later removed from the leads.

In the preferred embodiment, the ground plane 60 is outward of the logic traces along the upwardly extending sides of the bent flex connector 10. Thus the ground plane leads extending from the insulated portion 88 are above the logic carrier leads as they emerge from the insulation as just beyond point B.

In the preferred embodiment, the distance between the outer vertical side walls of the connector at point C is approximately 0.610+/−0.010 inches. Point C lies 0.210+/−0.015 inches above the plane of horizontal portion. The vertical distance between point C and B is 0.100+/−0.010 inches. The vertical distance between point B and point E is 0.075+/−0.010 inches. This structure reduces stress of the flex connector to a minimum while at the same time permitting compactness. The lifetime of the connector in operational conditions such as experienced in military environments can be expected to be within military specifications.

I claim:

1. An improved flex circuit connector, where the connector has a plurality of logic traces and holes in the traces adapted for mating the logic traces with the head pins of a head connector, and at least two layers of insulation sandwiching said logic traces and holding them in flexible planar alignment, the layers of insulation terminating in at least one end, the connector further including a plurality of leads connected to the logic traces and extending from said at least one end of said layers of insulation, the leads adapted for solder connection to corresponding pads of a daughter board, the improvement comprising:
   a ground plane;
   a third layer of insulation between the ground plane and the logic traces;
   a plurality of holes formed in the ground plane adapted for mating to other of said head pins of said head connector; and
   a plurality of leads connected to the ground plane, extending from said layers of insulation and adapted for solder connection to other of the pads of the circuit board, the leads interspersed among the leads of the logic traces.

2. The improved flex connector of claim 1 further including a bending structure comprising:
   a horizontal planar head section having the holes mounted therein;
   a first pair of bends at opposite ends of the planar section, and bending the opposite sides of the flex connector to the vertical direction;
   each side having an inward bend in the insulated portion of the side prior to the point where the leads extend from the insulated portion;
   the leads of the logic traces and the ground plane undergoing a smooth transition from a point just inside said insulation until a second point wherein the leads of the logic traces and the ground plane are in planar alignment; and
   the leads of both the logic traces and the ground plane having an outward bend to orient them vertically from the second point where the leads of the logic traces and ground plane are in alignment.

3. The improved flex connector of claim 2 wherein the ground plane is outward from the logic traces in the sides of the flex connector.

4. The improved flex connector of claim 1 wherein a number of said plurality of logic traces comprises power circuit traces and wherein the holes of said traces and said ground plane are aligned in rows and columns and wherein each trace hole not comprising a power trace circuit is adjacent in either a row or column to a power circuit hole or a ground plane hole.

5. The improved flex connector of claim 4 wherein each column has five holes, the power circuit holes are located eight columns apart, each column having a power circuit lead has two power circuit leads in the first and fifth rows and a ground plane lead in the third row, the second column from each column having a power circuit hole has two ground holes located in the second and fourth rows, and wherein the fourth column from each column having a power circuit hole has three ground holes located in the first, third and fifth rows.

6. The improved flex connector of claim 2 wherein a number of said plurality of logic traces comprise power circuit traces and wherein the holes of said traces and said ground plane are aligned in rows and columns and wherein each logic trace hole not comprising a power trace circuit is adjacent in either a row or column to a power circuit hole or a ground plane hole.

7. The improved flex connector of claim 6 wherein each column has five holes, the power circuit holes are located eight columns apart, each column having a power circuit lead has two power circuit leads in the first and fifth rows and a ground plane lead in the third row, the second column from each column having a power circuit hole has two ground holes located in the second and fourth rows, and wherein the fourth column from each column having a power circuit hole has three ground holes located in the first, third and fifth rows.

8. An improved flex circuit connector, where the connector has a plurality of logic traces and means for connecting the logic traces with external circuits, and at least two layers of insulation sandwiching said logic traces, and holding them in flexible planar alignment, the layers of insulation terminating in at least one end, the connector further including a plurality of leads connected to the logic traces and extending from said at least one end of said layers of insulation, the leads adapted for solder connection to corresponding pads of a circuit board, the improvement comprising:
   a ground plane;
   a third layer of insulation between the ground plane and the logic traces; and
   a plurality of leads connected to the ground plane, extending from said layers of insulation and adapted for solder connection to other of the pads of the circuit board, the leads interspersed among the leads of the logic traces.

* * * * *